United States Patent [19]

Ogawa

[11] Patent Number: 5,566,371
[45] Date of Patent: Oct. 15, 1996

[54] SEMICONDUCTOR MEMORY DEVICE CAPABLE OF DATA TRANSFER BETWEEN MEMORY ARRAYS COUPLED TO DIFFERENT DATA PINS AND OPERATING METHOD THEREOF

[75] Inventor: Toshiyuki Ogawa, Hyogo-ken, Japan

[73] Assignee: Mitsubishi Denki Kabushiki Kaisha, Tokyo, Japan

[21] Appl. No.: 282,763

[22] Filed: Jul. 29, 1994

Related U.S. Application Data

[63] Continuation of Ser. No. 45,311, Apr. 12, 1993, abandoned, which is a continuation of Ser. No. 853,027, Mar. 18, 1992, abandoned, which is a continuation of Ser. No. 545,781, Jun. 29, 1990, abandoned.

[30] Foreign Application Priority Data

Jan. 19, 1990 [JP] Japan ..................................... 2-11496

[51] Int. Cl.$^6$ ............................................. G11C 8/00
[52] U.S. Cl. .............................. 365/230.03; 365/230.05; 365/230.09; 365/220; 365/281; 365/189.05; 365/174; 365/219
[58] Field of Search ................................. 365/220, 221, 365/189.05, 230.03, 230.05, 230.09, 219, 174

[56] References Cited

U.S. PATENT DOCUMENTS

| | | | |
|---|---|---|---|
| 4,450,560 | 5/1984 | Conner | 371/25.1 |
| 4,562,555 | 12/1985 | Ouchi et al. | 365/189.03 |
| 4,628,480 | 12/1986 | Floyd | 395/309 |
| 4,636,986 | 1/1987 | Pinkham | 365/189.02 |
| 4,758,747 | 7/1988 | Young et al. | 326/40 |
| 4,766,593 | 8/1988 | Cates | 371/21.1 |
| 4,771,285 | 9/1988 | Agrawal et al. | 340/825.83 |
| 4,817,054 | 3/1989 | Banerjee et al. | 365/189.02 |
| 4,855,954 | 8/1989 | Turner et al. | 326/38 |
| 4,891,794 | 1/1990 | Hush et al. | 365/189.04 |
| 4,930,108 | 5/1990 | Sugiyama | 365/230.02 |
| 4,937,788 | 6/1990 | Harade | 365/189.04 |
| 4,964,076 | 10/1990 | Schurk | 340/825.5 |
| 4,974,199 | 11/1990 | Verbanets, Jr. et al. | 395/837 |
| 4,984,214 | 1/1991 | Hiltebeitel et al. | 365/230.05 |
| 4,987,559 | 1/1991 | Miyauchi et al. | 365/189.04 |
| 4,995,003 | 2/1991 | Watanabe et al. | 365/189.05 |
| 5,001,671 | 3/1991 | Koo et al. | 365/200.05 |
| 5,028,821 | 7/1991 | Kaplinsky | 326/41 |
| 5,040,149 | 8/1991 | Ebihara et al. | 365/189.05 |
| 5,042,013 | 8/1991 | Sato | 365/230.05 |
| 5,060,140 | 10/1991 | Brown et al. | 395/285 |
| 5,097,447 | 3/1992 | Ogawa et al. | 365/200 |
| 5,109,406 | 4/1992 | Mano e al. | 379/94 |
| 5,115,413 | 5/1992 | Sato et al. | 365/230.09 |

FOREIGN PATENT DOCUMENTS

0324470  7/1989  European Pat. Off. .

Primary Examiner—Tod R. Swann
Assistant Examiner—J. Peikari
Attorney, Agent, or Firm—Lowe, Price, LeBlanc & Becker

[57] ABSTRACT

A dual port random access memory capable of inputting/outputting data bit by bit includes a plurality of memory cell arrays (100a, 100b, 100c, 100d) accessible in parallel, a plurality of data registers (9a, 9b, 9c, 9d) arranged to be connected to memory arrays, and transfer gates (8a', 8b', 8c', 8d') for selectively connecting each of the data registers to one memory array in response to a destination designating signal. The transfer gate includes elements (T1, T2) for connecting the data registers and the memory arrays such that each of the plurality of memory arrays is connected to different data registers. Each of the data registers is capable of transferring data of one row of the memory array at one time. The data register is capable of serially inputting and outputting data. This structure enables rearrangement of data and transfer of data row by row between memory arrays in the memory device.

6 Claims, 8 Drawing Sheets

FIG.1 PRIOR ART

FIG. 2 PRIOR ART
READ TRANSFER CYCLE

FIG. 3 PRIOR ART
WRITE TRANSFER CYCLE

SEMICONDUCTOR MEMORY DEVICE CAPABLE OF DATA TRANSFER BETWEEN MEMORY ARRAYS COUPLED TO DIFFERENT DATA PINS AND OPERATING METHOD THEREOF

This application is a continuation of application Ser. No. 08/045,311 filed Apr. 12, 1993, which is a continuation of application Ser. No. 07/853,027 filed Mar. 18, 1992 which is a continuation of application Ser. No. 07/545,781 filed Jun. 29, 1990, all now abandoned.

CROSS REFERENCE

Cross reference is made to U.S. application Ser. No. 07/969,536, titled "DUAL PORT MULTIPLE BLOCK MEMORY CAPABLE OF TIME DIVISION OPERATION", filed Oct. 30, 1992, and commonly assigned with the present application.

BACKGROUND OF THE INVENTION

1. Field of the Invention

The present invention relates to a semiconductor memory device and, more specifically, to a semiconductor memory device having a plurality of memory cell arrays and being accessible bit by bit. More specifically, the present invention relates to a multiport memory used for image data processing, having a random access memory port which can be accessed at random and a serial access memory port which can only be accessed serially.

2. Description of the Background Art

In the field of image information processing and the like, image information processed or to be processed is displayed on a CRT (Cathode Ray Tube) display. In such a case, a memory, called a frame buffer, storing image information of 1 frame is often used. When a general dynamic random access memory (DRAM) is used as the frame buffer, data must be continuously read from the DRAM during the display period in order to form video signals to be displayed on the screen of the CRT display.

In a common DRAM, 1 memory cycle is defined either as a read cycle or a write cycle. Therefore, during the display period, an arithmetic processing apparatus (CPU) for carrying out arithmetic operations on image data can not access the DRAM, and the access period of the CPU to the frame buffer is limited in the horizontal or vertical blanking period other than display period. Consequently, wait time of the CPU is increased, and execution of the program becomes slower.

In order to overcome such a drawback of the common DRAM used as the frame buffer, a memory called a dual port RAM has come to be widely used as a video RAM for image processing.

The dual port RAM has an input/output port which can be accessed at random from the CPU, and a serial input/output port for serially reading data to be displayed under the control of a CRT display controller to apply the same to the CRT display. In the dual port RAM, when data of 1 row (corresponding to data of 1 horizontal scanning) are transferred from a RAM port (memory portion which can be accessed at random) to a SAM port (memory portion which can only be accessed serially), data to be displayed are read from the SAM port during the display period while the CPU can access the RAM port. This reduces the wait time of the CPU, increasing the speed of execution of the program. In the SAM port, the transferred data of 1 row are serially read, so that access time in the SAM port can be reduced to about ¼ or ⅕ that of the RAM port, enabling display of images at high speed.

Figure 1:
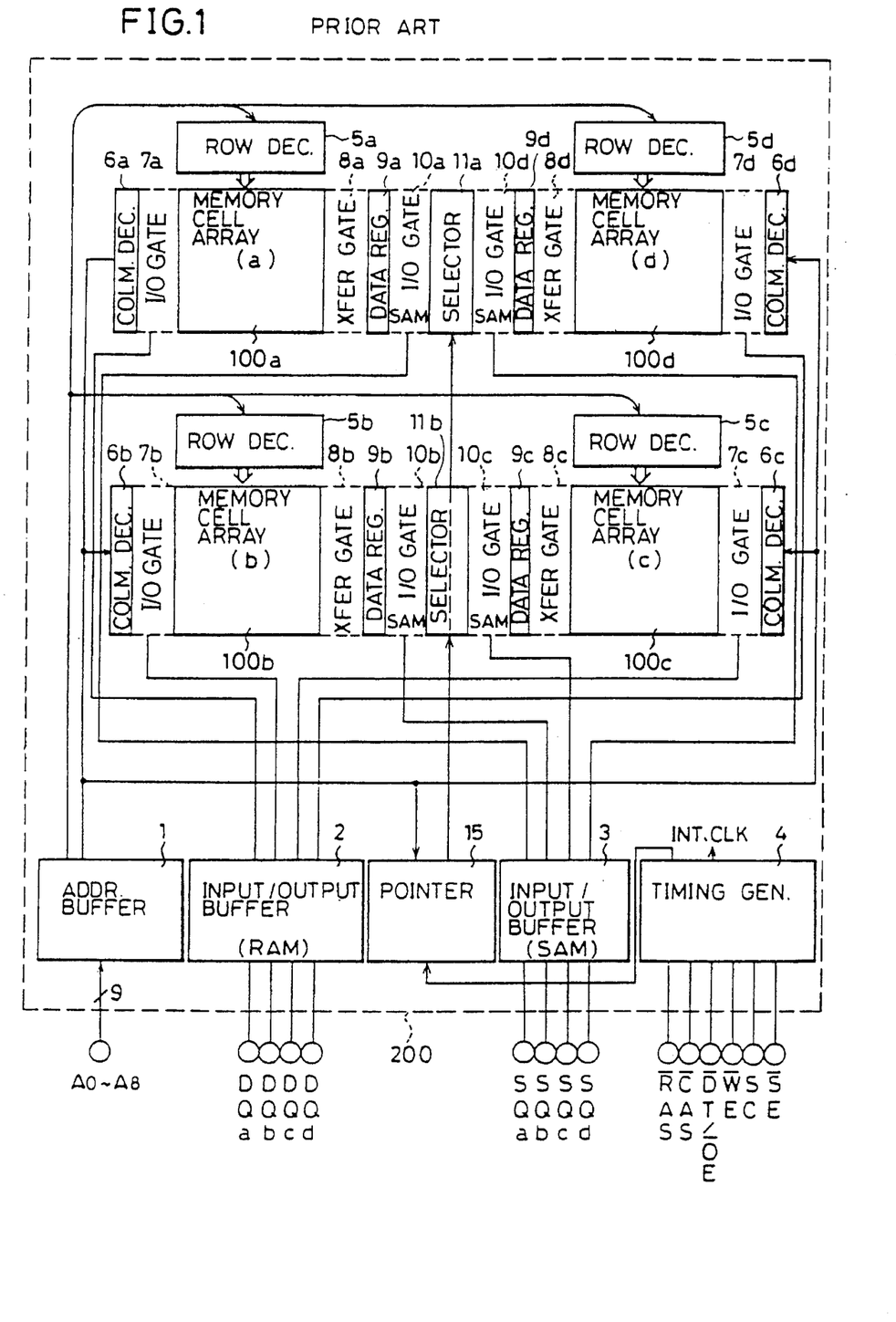
FIG. 1 schematically shows a whole structure of a conventional semiconductor memory device.

FIG. 1 schematically shows a whole structure of a conventional dual port RAM having a 256K word×4 bit structure. Referring to FIG. 1, the conventional dual port RAM comprises four memory cell arrays 100a, 100b, 100c and 100d. Although not specifically shown, each of the memory cell arrays 100a to 100d has a plurality of memory cells (for example, 256K bits) arranged in a matrix of M rows×N columns (for example, 512 rows ×512 columns).

Provided are an address buffer 1 receiving externally applied address signals A0 to A8 to generate internal address signals for accessing the memory cell arrays 100a to 100d at random; row decoders 5a, 5b, 5c and 5d provided corresponding to each of the memory cell arrays 100a to 100d, responsive to internal row address signals from the address buffer 1 to select corresponding rows of the memory cell arrays; column decoders 6a, 6b, 6c and 6d provided corresponding to each of the memory cell arrays 100a to 100d, responsive to internal column address signals from the address buffer 1 to generate signals for selecting corresponding columns (bit lines) of the memory cell arrays; and I/O gates 7a, 7b, 7c and 7d provided corresponding to each of the memory cell arrays 100a to 100d, responsive to column select signals from the corresponding column decoders to connect selected columns of the corresponding memory cell arrays to a RAM input/output buffer 2.

The RAM input/output buffer 2 is connected to data input/output terminals DQa, DQb, DQc and DQd. The address buffer 1 time-divisionally receives external row address signals and column address signals, and generates internal row address signals and internal column address signals at prescribed timings. In a data writing mode, the RAM input/output buffer 2 buffers and applies data applied to the data input/output terminals DQa to DQd to each of the I/O gates 7a to 7d. In a data reading mode, the RAM input/output buffer 2 buffers data signals transmitted through the I/O gates 7a to 7d to transmit the same to data input/output terminals DQa to DQd, respectively. Namely, in the structure shown in FIG. 1, the semiconductor memory device is capable of inputting/outputting data 4 bits by 4 bits, and each of the memory cell arrays 100a to 100d stores 1 bit of the data bits.

In order to enable serial accessing, the semiconductor memory device further comprises data registers 9a, 9b, 9c and 9d provided corresponding to each of the memory cell arrays 100a to 100d having storage capacity enough to store data (N bits) of one row of the corresponding memory cell array; transfer gates 8a, 8b, 8c and 8d provided between the memory cell arrays and the data registers, respectively for providing data transfer paths between the corresponding memory cell arrays and the data registers; selectors 11a and 11b provided common to 2 data registers, responsive to a selection clock signal from a pointer 15 to generate a signal for selecting a corresponding bit of the data register; and SAM I/O gates 10a, 10b, 10c and 10d provided corresponding to each of the data registers 9a to 9d, responsive to the bit selecting signals from the selectors 11a and 11b for connecting the selected bits of the corresponding data registers to a SAM input/output buffer 3.

The pointer 15 generates signals for successively and serially selecting bits of the data registers from the corresponding columns of the data registers 9a to 9d, in response to internal column address signals from the address buffer 1 and to clock signals from a timing generator 4, to apply the same to the selectors 11a and 11b. The SAM input/output buffer 3 is connected to SAM data input/output terminals SQa, SQb, SQc and SQd. The SAM input/output buffer 3 inputs/outputs 4 bits of data in parallel. Therefore, each of the SAM I/O gates 10a to 10d provides a path for inputting/outputting each bit of the serial data in one to one correspondence. The reference numeral 200 denotes a semiconductor chip.

In order to define internal operation timing of the semiconductor memory device, a timing generator 4 is provided which receives signals $\overline{RAS}$, $\overline{CAS}$, $\overline{DT/OE}$, $\overline{WE}$, SC and $\overline{SE}$ and generates various internal clocks. The signal $\overline{RAS}$ is a signal for providing a timing to take row address signals in the device and defining operation timing of a row selecting circuitry. The signal $\overline{CAS}$ is a signal for providing a timing to take column address signals in the device and defining operation timing of a column selecting circuitry in this device. The signal $\overline{DT/OE}$ is a signal for providing timing of data transfer between the memory cell arrays 100a to 100d and the corresponding data registers 9a to 9d, which signal is also used as an output enable signal in the semiconductor memory device.

The signal $\overline{WE}$ is used to set the semiconductor memory device to a writing mode. The signal $\overline{SE}$ enables the SAM port for carrying out serial data access. The signal SC provides an input/output timing of the data in the SAM port and, more specifically, it provides timing for the serial selecting operation in the selectors 11a and 11b. Namely, the pointer 15 designates a bit position of the data register which is selected at first, based on the column address signal from the address buffer 1, and selects bits of the data register by shifting bit by bit successively in response to the signal SC, starting from the designated bit position. Namely, the pointer 15 and the selectors 11a and 11b maybe regarded as one shift register, and the signal SC provides timing of shifting of the shift register. The operation will be described in the following.

Input/output of data in the RAM port is done in the same manner as in a common DRAM. Namely, the address signals A0 to A8 are multiplexed time divisionally to be applied to the address buffer 1. The address signals applied to the address buffer 1 are decoded by the row decoders 5a to 5d and by the column decoders 6a to 6b in response to the signals $\overline{RAS}$ and $\overline{CAS}$, respectively. Consequently, a 1 bit memory cell is selected in each of the memory cell arrays 100a to 100d. Designation of data writing is done by setting the control signal $\overline{WE}$ to "L", while designation of data reading operation is done by setting the control signal $\overline{DT/OE}$ to "L". In data writing operation, data applied to the RAM data input/output terminals DQa to DQd are converted into internal data through the input/output buffer 2, and thereafter they are stored in the selected memory cells, respectively, through the I/O gates 7a to 7d. In data reading, the data of the selected memory cells are applied to the input/output buffer 2 through the I/O gates 7a to 7d, and the internal data signals are converted into corresponding output data signals to be applied to the data input/output terminals DQa to DQd.

The data input/output operation in the SAM port will be described.

Reading of data from the SAM port is also carried out by the row address signals transferring data of 1 row from the memory cell arrays 100a to 100d to the corresponding data registers 9a to 9d, under the control of the address signals A0 to A8 and the signals $\overline{RAS}$, $\overline{CAS}$, $\overline{DT/OE}$ and $\overline{WE}$. On this occasion, the column signal strobed in response to the signal $\overline{CAS}$ is loaded to the pointer 15. The bits (1 bit from each of the memory cell arrays 100a to 100d, total 4 bits) designated by the column address signal loaded in the pointer 15 are the first bit which are to be transmitted to the SAM input/output buffer 3 from the registers 9a and 9d.

Then, when the signal SC (Serial Control) is toggled, the content of the pointer 15 is incremented under the control of the timing generator 4, and the content in each data registers 9a to 9d are successively transmitted bit by bit to the SAM input/output buffer 3 through the selectors 11a and 11b.

Writing of data to the SAM memory portion is reversed to the above described reading operation. Every time the control signal SC attains to "H", the 4 bit data applied to the SAM input/output buffer 3 are successively written to the data registers 9a to 9d. After the data of 1 row are written in each of the data registers 9a to 9d, by opening the transfer gates 8a to 8d by the signals $\overline{RAS}$, $\overline{CAS}$, $\overline{DT/OE}$ and $\overline{WE}$, the data from the corresponding data registers are written to the rows of the memory cell arrays 100a to 100d designated by the row address signals A0 to A8. The operation mode in the SAM port, that is, whether it is the reading mode or the writing mode, is determined by the direction of internal transfer carried out last time.

Figure 2:
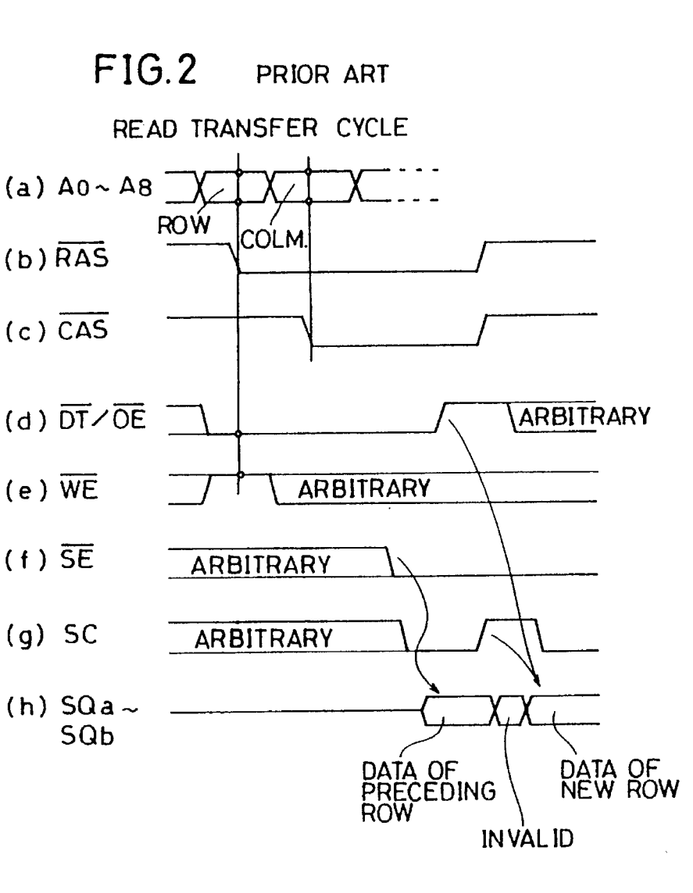
FIG. 2 is a diagram of signal waveforms showing a read transfer cycle operation in a conventional semiconductor memory device.
Figure 3:
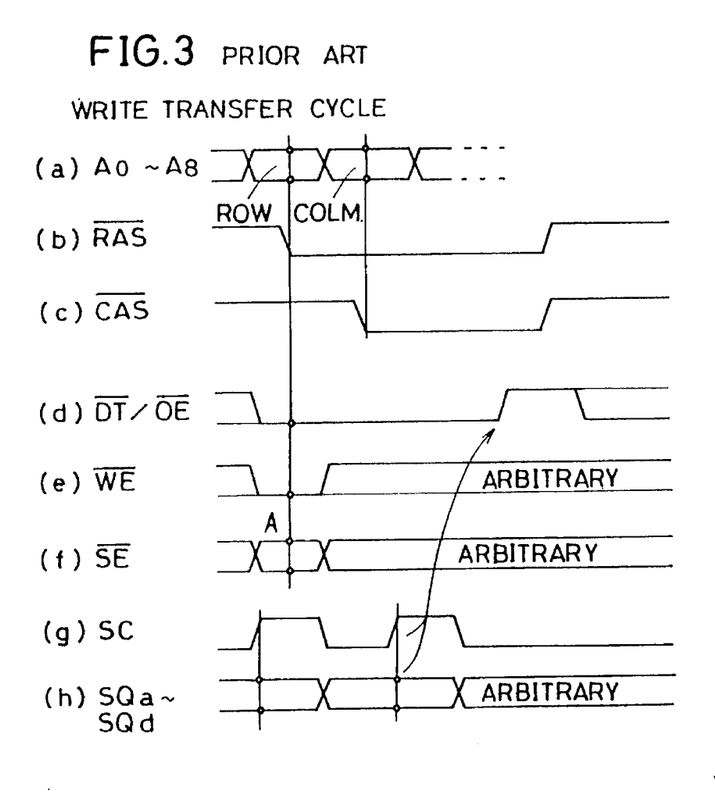
FIG. 3 is a diagram of signal waveforms showing a write transfer cycle operation in a conventional semiconductor memory device.

The internal transfer operation will be briefly described with reference to FIGS. 2 and 3, showing signal waveforms of the operation.

Referring to FIG. 2, a read transfer cycle, that is, data transfer from the RAM port to the SAM port will be described. In a data reading cycle, when the signal $\overline{DT/OE}$ is set to "L", the signal $\overline{WE}$ is set to "H" and the signal $\overline{SE}$ is set to an arbitrary state with the signal $\overline{RAS}$ being active "L", then, after the completion of data reading in the memory cell arrays 100a to 100d, that is, after the data of the memory cells connected to the selected row in the memory cell arrays 100a to 100d are transmitted to the bit lines (columns) and established, the transfer gates 8a to 8d are opened in response to the rise of the signal $\overline{DT/OE}$, and the data are transferred to the data registers 9a to 9d to be latched therein.

For the data of 1 row transmitted to the data registers 9a to 9d, the column address signal strobed to the address buffer 1 in response to the signal $\overline{CAS}$ is loaded to the pointer 15 and designates the first bit of the data registers 9a to 9d to be outputted to the SAM input/output buffer 3 through the selectors 11a and 11b.

Data reading from the SAM input/output buffer is generally carried out after the completion of data transfer to the data registers 9a to 9d, in response to the control signal SC, $\overline{SE}$. Consequently, data of 1 bit (total 4 bits) selected from each of the memory cell arrays 100a to 100d is read from the input/output terminals SQa to SQd in response to the control signal SC.

A write transfer cycle operation in which data are transferred from the SAM port to the RAM port will be described with reference to FIG. 3. In accordance with the same timing as in the read transfer cycle, if the signal $\overline{WE}$ is set to "L", the signal $\overline{DT/OE}$ is set to "L" and the signal $\overline{SE}$ to "L" with the signal $\overline{RAS}$ being active "L", the transfer gates 8a to 8d are opened in response to the rise of the signal $\overline{DT/OE}$, and the contents written in the data registers 9a to 9d are written at one time to the selected rows of the memory cell arrays 100a to 100d. The write transfer cycle is generally carried after the completion of data writing to the data registers 9a to 9d from the SAM input/output buffer 3.

In the write transfer cycle, when the signal $\overline{RAS}$ attains to the active "L" level and the signal $\overline{SE}$ is at "H", a pseudo write (masked write) transfer cycle is carried out. In the pseudo write transfer cycle, the transfer gates 8a to 8d are kept closed, and data transfer from the data registers 9a to 9d to the memory cell arrays 100a to 100d is not carried out. The pseudo write transfer cycle is carried out simply to switch the SAM port from the output mode to the input mode, since the operation mode of the SAM port is defined by the internal transfer cycle carried out in the last cycle.

If the signal $\overline{SE}$ is at "H", the SAM input/output buffer is not activated, so that data writing to the data registers 9a to 9d is not carried out.

As described above, in a conventional semiconductor memory device, registers for storing memory cell data of 1 row are provided corresponding to the memory cell arrays, and exchange of data between the memory cell array and external devices is done through the data registers in order to increase the speed of reading/writing of data.

However, inthe conventional structure, the data registers and the memory cell arrays are provided in one to one correspondence. The data register 9a is capable of transferring data only with the memory cell array 100a, for example, and data transfer to other memory cell arrays is impossible. Namely, the correspondence between the memory cell arrays, the SAM data input/output terminals SQa to SQd and the RAM data input/output terminals DQa to DQd are uniquely fixed.

Therefore, if 1 bit from each of the memory cell arrays 100a to 100d, that is, a total of 4 bits of data, forms 1 pixel, and the color or the light and shade of the displayed image is to be changed, the pixel data must be changed (rearranged) by using an external device. So, the device structure for changing the color or the light and shade becomes complicated, which prevents flexible changing of the color or the light and shade.

Let us assume that in image processing, three memory cell arrays correspond to R (Red), G (Green) and B (Blue), respectively and the remaining one memory cell array is used as an unused area or a working area. If the area displayed in red is to be displayed in green and the shape of the area displayed in red is to be changed, the data of the memory cell array corresponding to red must be transferred to the array corresponding to green, while the data of the memory cellarray of red must be rewritten.

However, in a conventional semiconductor memory device, data transfer between memory cell arrays can not be directly carried out, and the data must be once read from the data register, transferred outside the device to be stored in a buffer memory for operation, for example, and the red information must be written from the buffer memory to the desired memory cell array of green. Accordingly, data transfer between memory cell arrays can not be carried out at high speed, and consequently, desired image processing can not be done at high speed.

One example of a structure for reading data serially from the SAM port on real time in a dual port RAM is disclosed in U.S. Pat. No. 4,636,986. In this prior art, disclosed is a structure in which data registers (shift registers) provided for each of a plurality of memory arrays are cascade connected. However, data transfer at one time between different data registers is not carried out.

SUMMARY OF THE INVENTION

One object of the present invention is to provide an improved semiconductor memory device eliminating drawbacks of the above described conventional semiconductor memory device.

Another object of the present invention is to provide a semiconductor memory device capable of carrying out data processing at high speed.

A further object of the present invention is to provide a semiconductor memory device capable of facilitating flexible data processing at high speed.

A still further object of the present invention is to provide a semiconductor memory device for image processing having various functions, and capable of flexibily processing image data readily at high speed.

A still further object of the present invention is to provide a method of operating the semiconductor device for carrying out data processing at high speed.

A still further object of the present invention is to provide a method of operating a semiconductor device implementing flexible data processing.

The semiconductor memory device in accordance with the present invention comprises data registers provided corresponding to a plurality of memory cell arrays and each having storage capacity enough to store memory cell data of 1 row, and circuits provided corresponding to the data registers for selectively coupling the corresponding data registers to at least two memory cell arrays.

The coupling circuit includes a circuit responsive to a destination designating signal for selectively connecting the corresponding data register to one of the above mentioned at least two memory cell arrays for carrying data transfer between the connected data register and the memory cell array.

The method of operating the semiconductor memory device in accordance with the present invention comprises, in a semiconductor memory device having a plurality of memory arrays and a plurality of data registers each arranged to be able to be coupled to 2 memory cell arrays, the steps of: generating a data destination designating signal; connecting each of the plurality of data registers to one memory array in response to the data destination designating signal; and transferring data between the connected data register and the memory array.

The data register of the present invention can be connected to at least 2 memory cell arrays, and carries out data transfer with the connected memory cell array. Therefore, by changing coupling designations of the data registers by using the coupling circuits, data transfer between memory cell arrays becomes possible, and internal rearrangement of input/output data becomes possible.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
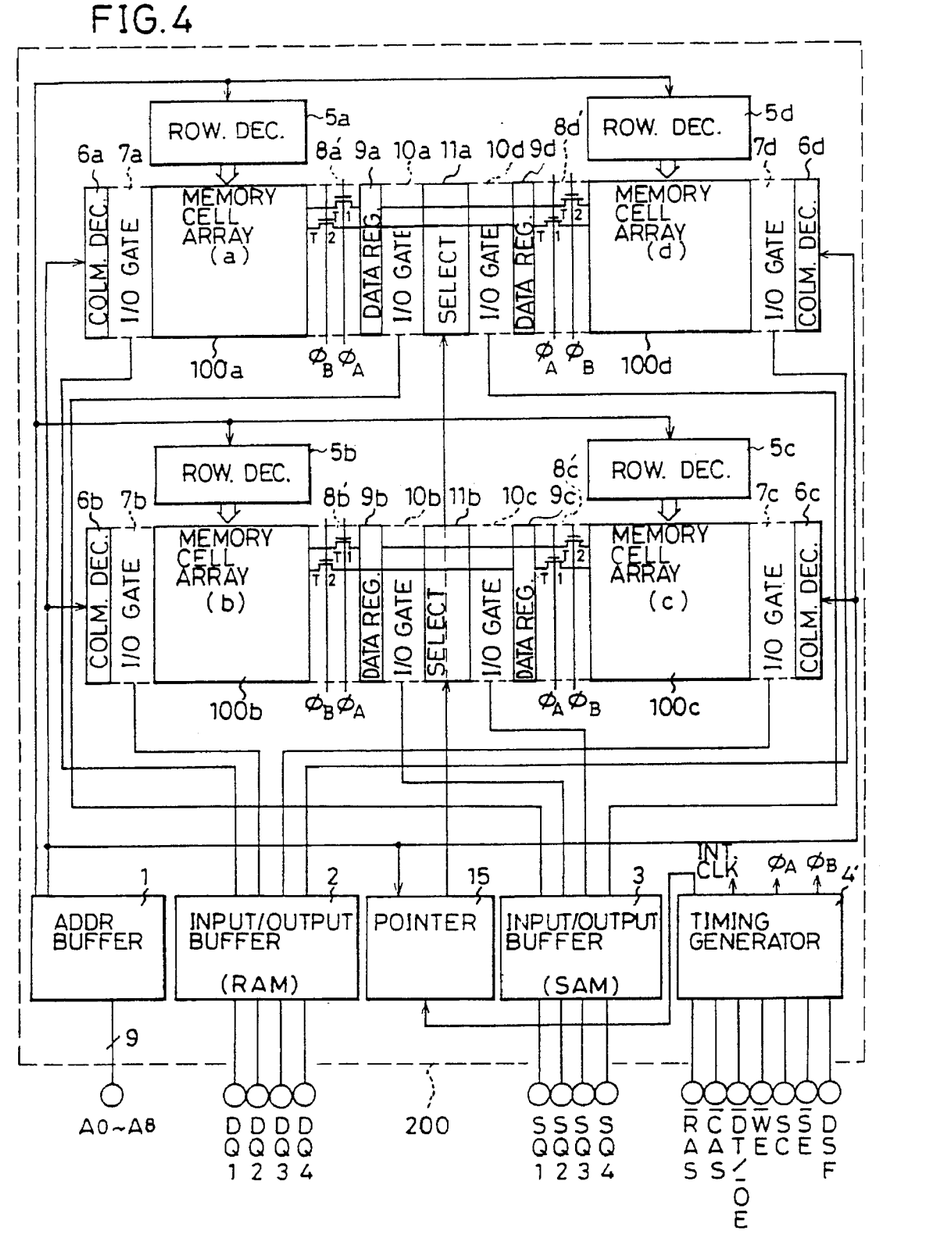
FIG. 4 schematically shows a whole structure of a semiconductor memory device in accordance with one embodiment of the present invention.

FIG. 4 schematically shows a whole structure of the semiconductor memory device in accordance with one embodiment of the present invention. The semiconductor memory device shown in FIG. 4 improves the semiconductor memory device of FIG. 1, and the portions corresponding to the components of the semiconductor memory device shown in FIG. 1 are denoted by the same reference characters. Referring to FIG. 4, each of the transfer gates 8a' to 8f' provided between memory cell arrays 100a to 100d and data registers 9a to 9d, respectively, comprises transfer control transistors T1 and T2 for switching connection path between memory cell arrays and data registers in response to destination designating signals $\phi_A$ and $\phi_B$. The transfer control transistor T1 connects the memory cell arrays 100a to 100d to the data registers 9a to 9d, respectively, in response to the destination designating signal $\phi_A$. The transfer control transistor T2 connects the memory cell arrays to data registers provided corresponding to adjacent memory cell arrays, in response to the destination designating signal $\phi_B$. More specifically, the memory cell array 100a is connected to the data register 9d by the transfer control transistor T2, while the memory cell array 100d is connected to the data register 9a by the transfer control transistor T2. Similarly, the memory cell arrays 100b and 100c are connected to the data registers 9c and 9b, respectively, through the transfer control transistor T2.

Accordingly, if the destination designating signal $\phi_A$ is generated, data transfer is carried out between the memory cell arrays 100a to 100b and the data registers 9a to 9d provided corresponding thereto, as in the conventional device. Meanwhile, if the destination designating signal $\phi_B$ is generated, the connection path between the memory cell arrays and the data registers are switched to change the destination of transfer, as from the data register to the neighboring memory cell array, which enables rearrangement of input/output data.

In this case, after the read transfer cycle is accomplished by raising the destination designating signal $\phi_A$ to write data from the memory cell array to the data register, activating the destination designating signal $\phi_B$ and carrying out the write transfer cycle would provide exchange of data between the memory cell arrays through the data register.

The transfer control signals $\phi_A$ and $\phi_B$ are generated from a timing generator 4' in response to an externally applied destination designating signal DSF. The internal transfer designating signals $\phi_A$ and $\phi_B$ are generated at substantially the same timing as the conventional transfer controlling signals, and in response to the external destination designating signal DSF, either the transfer controlling signal $\phi_A$ or $\phi_B$ is generated.

Although the transfer control transistors T1 and T2 are provided corresponding to each bit of the data registers, only two transistors T1 and T2 which become conductive in response to the internal transfer controlling signals $\phi_A$ and $\phi_B$, respectively, are shown as representatives, in order to simplify the drawing.

Figure 5:
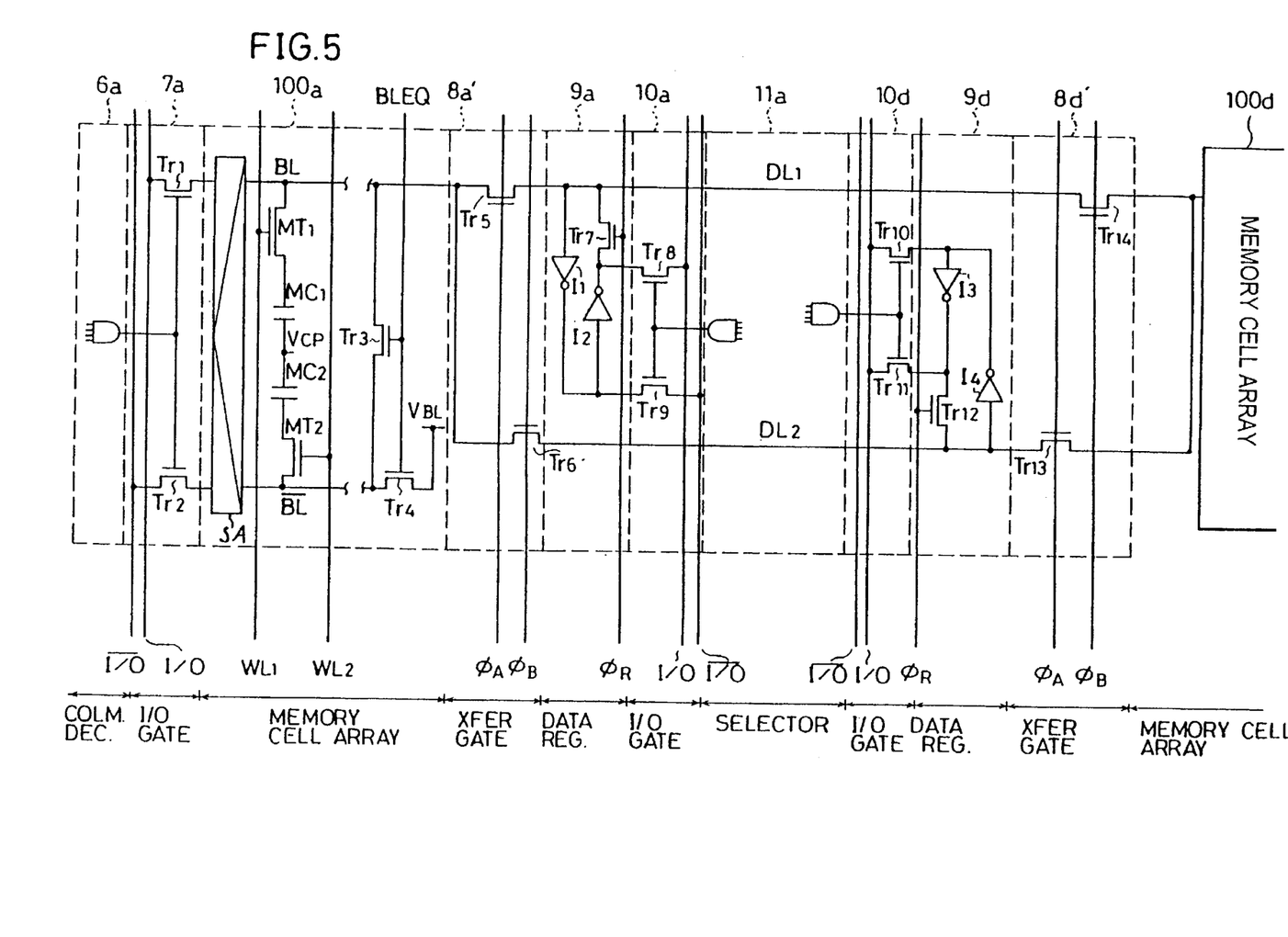
FIG. 5 shows a structure of a main portion of the semiconductor memory device shown in FIG. 4.

FIG. 5 shows a structure for carrying out transfer of 1 bit data between the memory cell arrays 100a and 100d. Referring to FIG. 5, the memory cell array 100a has a so-called folded bit line structure, and 1 column is formed by complementary bit line pair BL, $\overline{BL}$. The memory cell array 100a comprises memory cell capacitors MC1 and MC2 each storing information in the form of electric charges, a memory cell transistor MT1 which becomes conductive in response to a signal potential on a word line WL1 for connecting the memory cell capacitor MC1 to the bit line BL, and a memory cell transistor MT2 which becomes conductive in response to a signal potential on a word line WL2 for connecting the memory cell capacitor M2 to the complementary bit line $\overline{BL}$.

One memory cell comprises one memory cell transistor MD1 (MD2) and one memory cell capacitor MC1 (MC2). One electrode (cell plate) of the memory cell capacitor MC1 or MC2 is connected to a prescribed potential Vcp. The memory cell array 100a further comprises transistors Tr3 and Tr4 for precharging and maintaining the bit line pair BL, $\overline{BL}$ to a prescribed potential $V_{BL}$ at the end of 1 memory cycle (when the signal $\overline{RAS}$ is "H"). The transistor Tr3 becomes conductive in response to an equalize/precharge signal BLEQ for electrically short-circuiting the bit line pair BL, $\overline{BL}$. The transistor Tr4 becomes conductive in response to the precharge/equalize signal BLEQ to transmit the prescribed precharge potential $V_{BL}$ to the bit lines BL and $\overline{BL}$.

An I/O gate of the RAM port comprises transfer gate transistors Tr1 and Tr2 which become conductive in response to column selecting signals from the column decoder 6a for connecting the bit lines BL, $\overline{BL}$ to internal data input/output line pair I/O, $\overline{I/O}$, respectively.

The column decoder 6a is shown with the unit decoder formed by an AND gate, as an example.

The transfer gate 8a' comprises a transfer control transistor Tr5 which becomes conductive in response to the internal transfer control signal $\phi_A$ for connecting the bit line BL to the internal data transfer line DL1, and a transfer control transistor Tr6 which becomes conductive in response to the internal transfer controlling signal $\phi_B$ for connecting the bit lime BL to the internal data transfer line DL2.

The data register 9a comprises an inverter I1 for inverting signal potential on the internal data transfer line DL1, an inverter I2 for inverting the output from the inverter I1, and a latch control transistor Tr7 for connecting the output from the inverter I2 to the internal data transfer line DL1 in response to a controlling signal $\phi_R$. When the transistor Tr7 is conductive, the inverters I1 and I2 form a latch circuit for maintaining the signal potential on the internal data transfer line DL1, and when the transistor Tr7 is non-conductive, the inverters I1 and I2 form a buffer circuit of two stages of inverters.

The I/O gate 10a of the SAM port comprises transfer gate transistors Tr9 and Tr8 which become conductive in response to a column selecting signal from the selector 11a for connecting the outputs from the inverters I1 and I2 to the internal data transmitting line pair I/O, $\overline{I/O}$, respectively.

As an example, the selector 11a is shown with the unit selector formed functionally by an AND gate. In this case, the selector renders conductive the transistor pair included in the I/O gate 10a successively, dependent on the output from the pointer 15.

Similarly, the SAM port I/O gate 10d comprises transfer gate transistors Tr10 and Tr11. In the structure shown in FIG. 2, the transfer gate transistors included in the I/O gates 10a and 10d are made conductive by different selector outputs, respectively. However, the selector is provided common to two I/O gates, and therefore, the same bit selecting signal is applied to the AND gates (which is only the functional representation and the actual structure may be different) of the selector 11a.

The data register 9d comprises an inverter I4 for inverting signal potential on the internal data transfer line DL2, an inverter I3 for inverting the output from the inverter I4, and a latch control transistor Tr12 which becomes conductive in response to the control signal $\phi_R$ for connecting the output portion of the inverter I3 to the internal data transfer line DL2. The output of the inverter I4 is transmitted to the internal data line I/O through the transistor Tr10, and the output of the inverter I3 is transmitted to the complementary internal data line $\overline{I/O}$ through the transistor Tr11.

The transfer gate 8d' provided adjacent to the memory cell array 100d comprises a transistor Tr13 which becomes conductive in response to the internal transfer controlling signal $\phi_A$ for connecting the internal data transfer line DL2 with the bit line BL of the memory cell array, and a transfer control transistor Tr14 which becomes conductive in response to the internal transfer controlling signal $\phi_B$ for connecting the internal data transfer line DL1 to the bit line BL of the memory cell array 100d.

Figure 6:
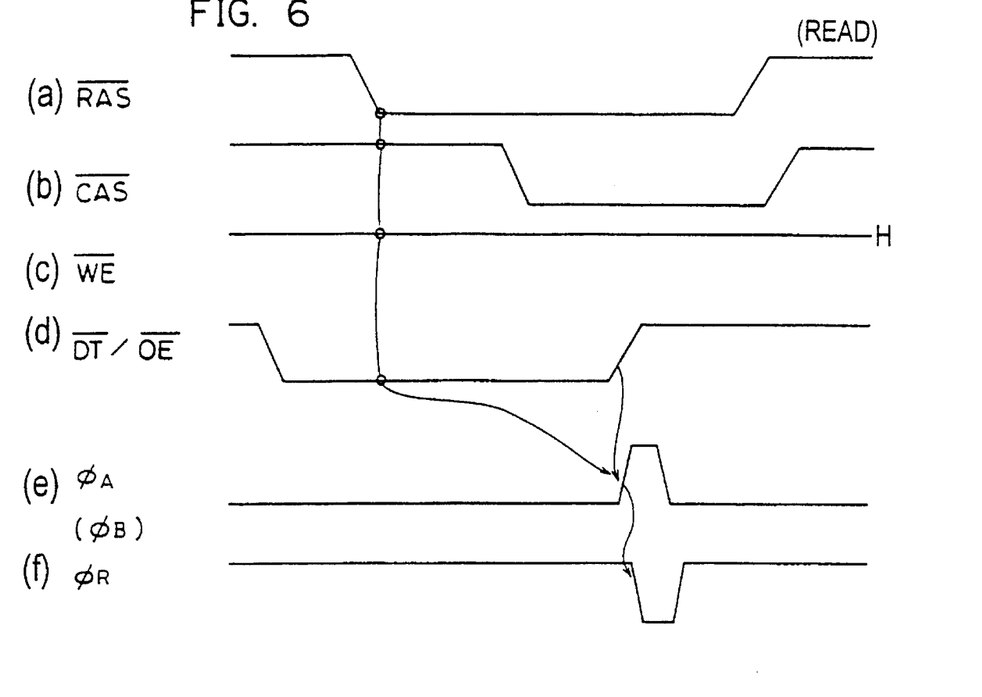
FIG. 6 is a diagram of signal waveforms showing a read transfer cycle operation in a semiconductor memory device shown in FIGS. 4 and 5.
Figure 7:
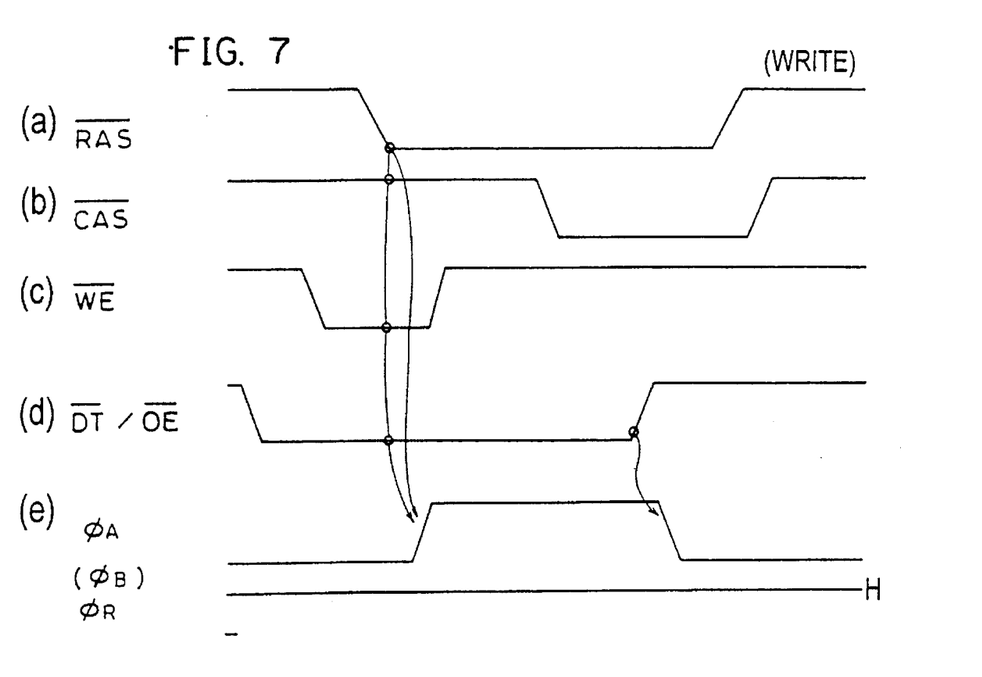
FIG. 7 is a diagram of signal waveforms showing a write transfer cycle operation of the semiconductor memory device shown in FIGS. 4 and 5.

The control signal $\phi_R$ has a function of temporarily disabling the ability of latching in a data register, so that the data transmitted from the memory cell array in read transfer cycle do not collide against the data latched in the data register and that the data are surely latched in the data register. The operation will be described with reference to FIGS. 6 and 7 showing the waveforms of operation.

Read transfer cycle operation will be described at first referring to FIG. 6. The read transfer cycle is set by setting, at the fall of the signal $\overline{RAS}$, the signal $\overline{CAS}$ to "H", the signal $\overline{WE}$ to "H" and the signal $\overline{DT/OE}$ to "L". In response to the fall of the signal $\overline{RAS}$, the row address signal is decoded, one word line (for example, WL1) is selected, and memory cells connected to the word line WL1 is connected to the associated bit lines. Now, let us assume that the data transfer is carried out between the memory cells and the data register provided adjacent to the memory cell array, and that an internal transfer controlling signal $\phi_A$ is generated.

The read potential on the bit lines BL and $\overline{BL}$ is sensed and amplified by a sense amplifier SA to be established, the control signal $\overline{CAS}$ falls to "L", and then the signal $\overline{DT/OE}$ rises. In response to the rise of the signal $\overline{DT/OE}$, the transfer controlling signal $\phi_A$ rises to "H". On this occasion, the control signal $\phi_B$ remains at "L". Consequently, referring to FIG. 5, the data registers 9a and 9d are connected to the memory cell arrays 100a and 100d, respectively. Consequently, the signal potential on the bit line BL of the memory cell array 100a is transmitted to the internal data transfer line DL1 through the transistor Tr5, and the signal potential on the bit line $\overline{BL}$ of the memory cell array 100d is transmitted to the data transfer line DL2 through the transistor Tr13.

In response to the rise of the control signal $\phi_A$, the control signal $\phi_R$ falls to "L". Consequently, the transistors Tr7 and Tr12 in the data registers 9a and 9d become non-conductive, whereby the data latching capability is disabled. Then, when the signal potentials on the internal data transfer lines DL1 and DL2 are changed to the signal potential level from the corresponding bit lines BL, $\overline{BL}$, the control signal $\phi_A$ attains to "L" and the control signal $\phi_R$ rises to "H", whereby the transistors Tr7 and Tr12 become conductive, while the transistors Tr5 and Tr13 become non-conductive. Consequently, the signal potentials on the internal data transfer lines DL1 and DL2 are latched in the latch circuit formed of the inverters I1 and I2 and the transistor Tr7 and by the latch circuit formed of the inverters I4 and I3 and the transistor Tr12, respectively, and thus data transfer from the memory cell array 100a to the data register 9a and from the memory cell array 100d to the data register 9d is completed. The data transfer to the data registers 9a and 9d is carried in the same manner in other columns, and accordingly, memory cell data of one row have come to be stored in the data register at one time.

When the control signal $\phi_B$ is selected instead of the control signal $\phi_A$ and it rises to "H", the transistors Tr6 and Tr14 become conductive, while the transistors Tr5 and Tr13 are turned off. Therefore, in this case, the data in the memory cell array 100a are latched in the data register 9d through the bit line BL, the transistor Tr6 and the internal data transfer line DL2, while the data in the memory cell array 100d are latched in the data register 9a through the transistor Tr14.

Now, when the data of the memory cells connected to the word line WL2 are to be stored in the data register, complementary data are read to the bit line BL by the sense amplifier SA to be stored in the data register. Generally, data opposite to the externally applied write data are written to be stored in the complementary bit line BL, so that there is no influence to the data reading operation even if the signal potential only of one bit line BL ($\overline{BL}$) is latched.

The write transfer cycle for transferring data from the data register to the memory cell array will be described.

As shown in FIG. 7, the write transfer cycle is set by setting the signal $\overline{CAS}$ to "H", the signal $\overline{WE}$ to "H" and the signal $\overline{DT/OE}$ to "L" at the fall of the signal $\overline{RAS}$ to "L". In the write transfer cycle, the transfer controlling signal $\phi_A$ rises to "H" in response to the fall of the signal $\overline{RAS}$. Consequently, the data written in the data registers 9a and 9d through the SAM input/output buffer 3 are transmitted to the memory cell arrays 100a and 100d through the transistors Tr5 and Tr13, respectively. Consequently, data are written to the memory cells connected to the word lines selected in response to the fall of this signal $\overline{RAS}$.

On this occasion, the sense amplifier SA is activated even in writing data, for differentially amplifying the signal potentials on the bit line pair BL, $\overline{BL}$. However, the latching capability of the data registers 9a and 9d is far larger than that of the sense amplifier SA. Therefore, if the control signal $\phi_A$ rises to "H" after the sense amplifier SA is activated, the potentials on the bit lines BL and $\overline{BL}$ correspond to the data latched in the data registers Qa and Qd. Even if the control signal $\phi_A$ falls to "L" in response to the rise of the control signal $\overline{DT/OE}$ to "H" and the memory cell arrays 100a and 100d are disconnected from the data registers 9a and 9d, respectively, the sense amplifier SA is kept active until the signal $\overline{RAS}$ rises to "H", so that the written signal potentials are maintained by the sense amplifier on the bit lines BL and $\overline{BL}$, whereby writing of the data of the selected one row of memory cells can be surely carried out.

Consequently, the data transfer operation from the data registers 9a and 9d to the memory cell arrays 100a and 100d is completed.

When the control signal $\phi_B$ is selected to be "H", the transistors Tr6 and TR14 become conductive, and the transistors Tr5 and Tr13 become non-conductive. Therefore, data latched in the data register 9a are transmitted to the memory cell array 100d through the internal data transfer line DL1 and the transistor Tr14, and the data latched in the data register 9d are transmitted to the memory cell array 100a through the internal data transfer line DL 2 and the transistor Tr6. Consequently, data are transferred from the data registers 9a and 9d to the memory cell arrays 100d and 100a. If the read transfer cycle is carried out by selecting the control signal $\phi_A$ and then the write transfer cycle is carried out by selecting the control signal $\phi_B$, then the transfer of data between the memory cell arrays 100a and 100d is done through the data registers 9a and 9d. Namely, exchange of memory cell data of one row is done at one time, which enables data transfer between memory cell arrays at high speed.

By carrying out only the read transfer cycle or only the write transfer cycle in the above described operations, it becomes possible to carry out data transfer between the memory cell array and the SAM input/output buffer, after a desired rearrangement of the data.

Although data transfer is carried out between the bit lines BL in the structure shown in FIG. 5, data transfer between bit lines and between complementary bit lines can be realized by connecting the transistors Tr6 and Tr13 to the complementary bit line $\overline{BL}$ of the memory cell arrays 00b and 100a, for example.

Figure 8:
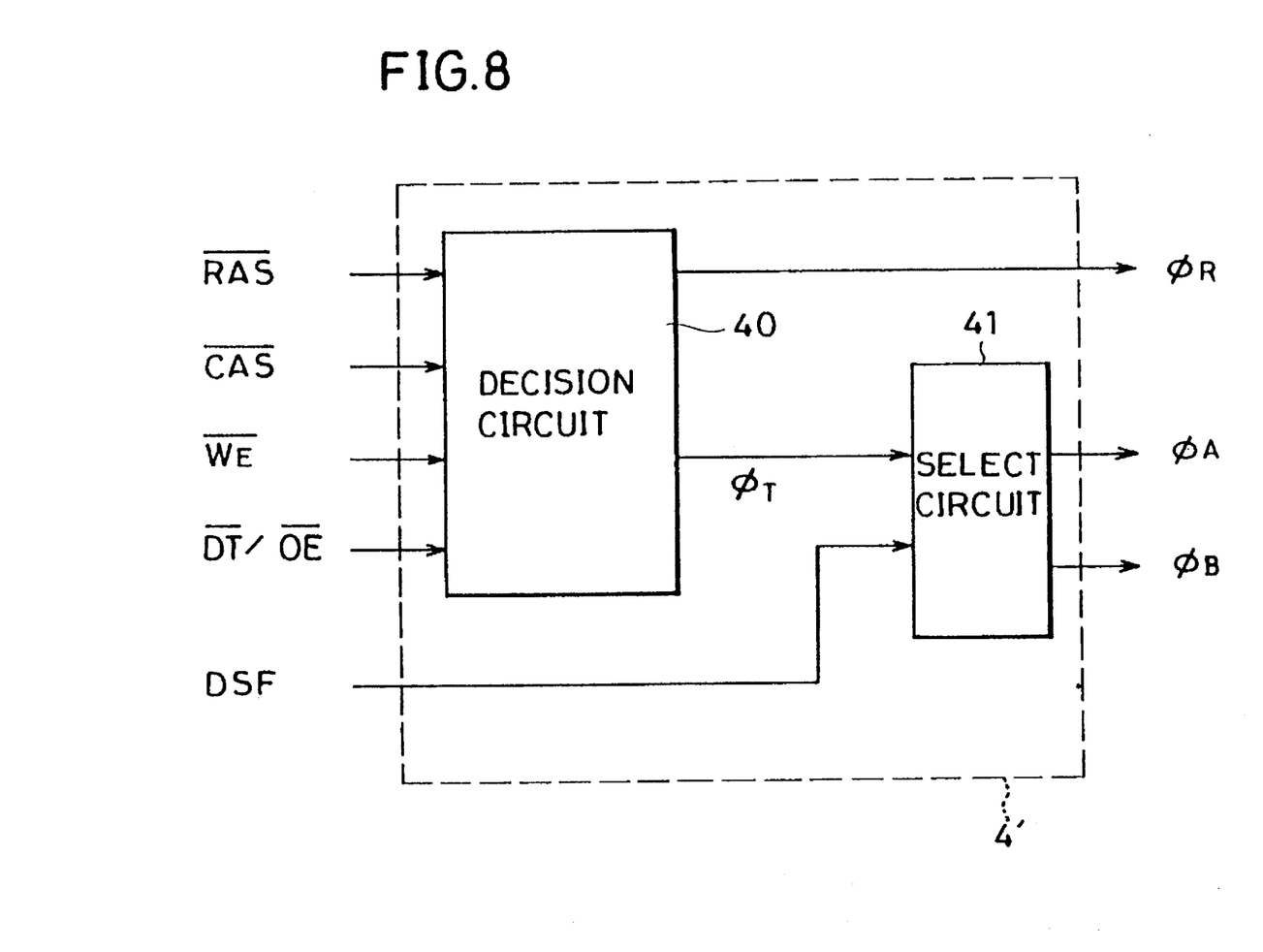
FIG. 8 schematically shows an example of a circuit structure for generating internal transfer control signals in the semiconductor memory device shown in FIGS. 4 and 5.

FIG. 8 shows an example of a circuit structure for generating the control signals $\phi_A$, $\phi_B$ and $\phi_R$. Referring to FIG. 8, the control signal generating circuit is included in the timing generator 4', and it comprises a determining circuit 40 receiving the signals $\overline{RAS}$, $\overline{CAS}$, $\overline{WE}$ and $\overline{DT/OE}$ for determining the operation cycle, and a selecting circuit 41 responsive to a transfer designating signal $\phi_T$ from the determining circuit 40 and to externally applied destination designating signal DSF for generating either the control signal $\phi_A$ or $\phi_B$. As shown in FIGS. 6 and 7, the determining circuit 40 detects the signal potentials of the signals $\overline{CAS}$, $\overline{WE}$ and $\overline{DT/OE}$ at the fall of the signal $\overline{RAS}$ to "L", and determines which operation mode is designated in response to the result of detection. If it is determined that the read transfer cycle is designated, the determining circuit 40 outputs the control signal $\phi_R$, which is provided by inverting and delaying the transfer designating signal $\phi_T$. If it is determined to be the write transfer cycle, the control signal $\phi_R$ is fixed at "H".

Although the destination designating signal is externally applied in the structure of FIG. 8 as an example, the destination may be designated by utilizing prescribed timing relations between the control signals $\overline{RAS}$, $\overline{CAS}$, $\overline{WE}$ and $\overline{DT/OE}$. The destination designating signal DSF may be applied through an extra pin terminal provided additionally to the semiconductor memory device. Further, by using a pin which becomes unnecessary in designating the data transfer mode (for example, the data input/output pin or an address pin), the control signals $\phi_A$ and $\phi_B$ may be selectively generated by the combination of the signal potential on the pin terminal and the prescribed timing relation of the control signals $\overline{RAS}$, $\overline{CAS}$, $\overline{WE}$ and $\overline{DT/OE}$.

Although the example shown in FIG. 4 is structured to enable data transfer between left and right adjacent memory cell arrays, it is possible to provide a structure realizing data transfer between upper and lower adjacent memory cell arrays in the figure. It can be readily expanded by increasing the number of transfer control gate transistors corresponding to the number of memory cell arrays to which the data are to be transferred.

Figure 9:
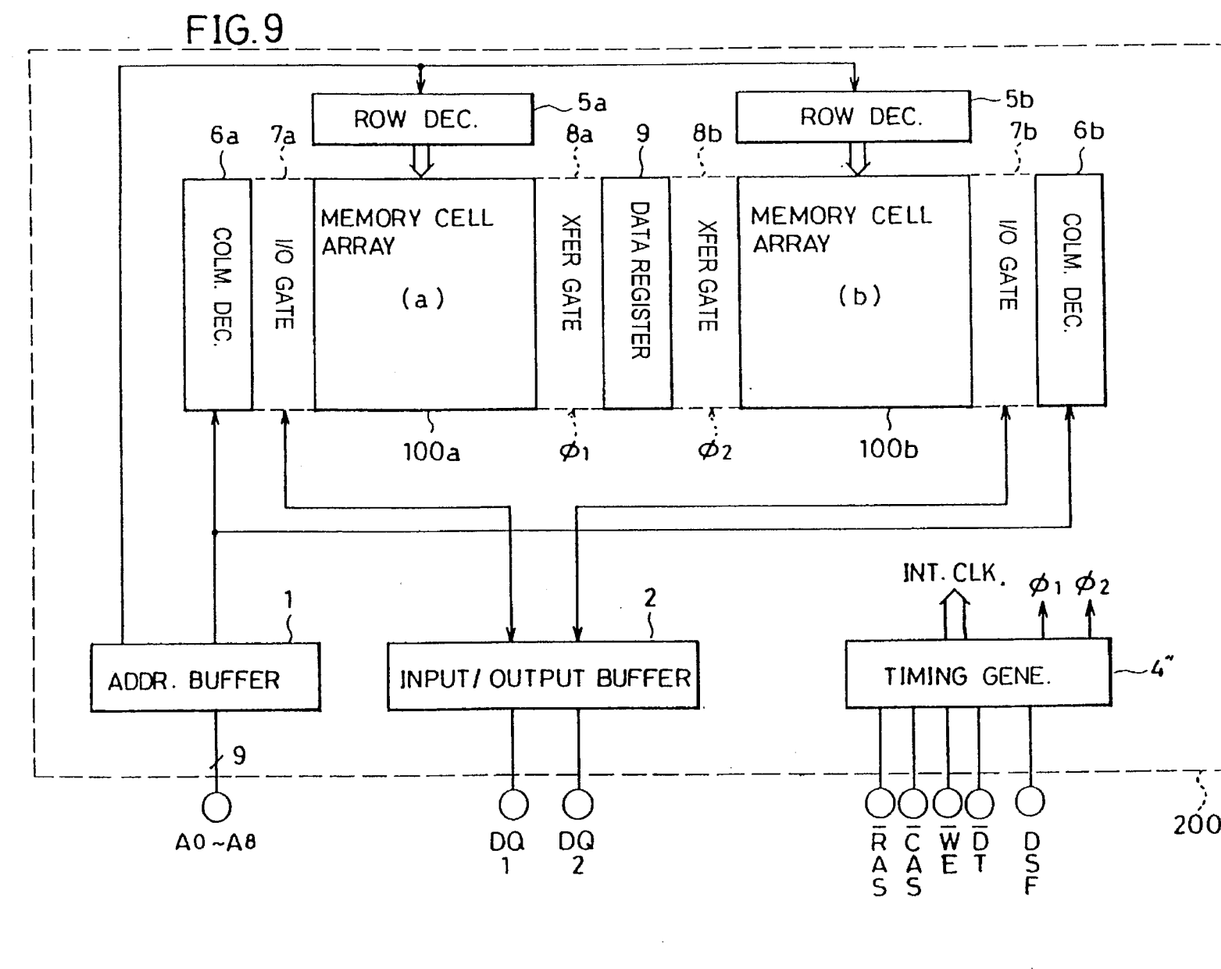
FIG. 9 schematically shows a whole structure of a semiconductor memory device in accordance with another embodiment of the present invention.

In the above described embodiment, the data registers are provided corresponding to the memory cell arrays, and the connecting paths between the data registers and the memory cell arrays are switched. However, in a structure having a plurality of memory cell arrays and the data bits are outputted in parallel from the memory cell arrays, as in a common DRAM, the data transfer between memory cell arrays may be realized by providing additional data registers between the memory cell arrays. FIG. 9 shows one example of such a structure.

FIG. 9 schematically shows a whole structure of a semiconductor memory device in accordance with another embodiment of the present invention. Referring to FIG. 9, the semiconductor memory device comprises two memory cell arrays 100a and 100b. For the memory cell array 100a, provided are a row decoder 5a responsive to an internal row address from an address buffer 1 for generating a signal to select one row of the memory cell array 100a, a column decoder 6a responsive to an internal column address signal from the address buffer 1 for generating a signal to select one column of the memory cell array 100a, and an I/O gate 7a responsive to the column selecting signal from the column decoder 6a for connecting the selected memory cell to an input/output buffer 2. Similarly, for the memory cell array 100b, provided are a row decoder 5b, a column decoder 6b and an I/O gate 7b. The row decoder 5b and the column decoder 6b receive the internal row address signal and the internal column address signal from the address buffer 1, respectively.

In a common DRAM, 1 bit memory cell is selected in each of the memory cell arrays 100a and 100b in response to externally applied address signals A0 to A8, and the exchange of data is carried out between the selected memory cells and the external device through the input/output buffer 2 and the input/output terminals DQ1 and DQ2.

The semiconductor memory device further comprises a data register 9 and transfer gates 8a and 8b provided between the memory cell arrays 100a and 100b. The transfer gate 8a becomes conductive in response to an external transfer control signal $\phi1$ to connect the memory cell array 100a to the data register 9. The transfer gate 8b becomes conductive in response to an internal transfer controlling signal $\phi2$ to connect the data register 9 and the memory cell array 100b.

The data register 9 has a capacity enough to store the data of memory cells of 1 row of the memory cell arrays 100a and 100b, and it is capable of transferring data with the memory cell arrays 100a and 100b through the transfer gates 8a and 8b, respectively. The internal transfer controlling signals $\phi1$ and $\phi2$ controlling the operations of the transfer gates 8a and 8b are generated by a timing generator 4". The timing generator 4" selectively connects the data register 9 to either the memory cell array 100a or 100b, in response to the destination designating signal DSF and to the transfer designating signal DT.

The data transfer operation is the same as that of the semiconductor memory device shown in FIG. 4. Designation of the read transfer cycle (transfer of data of one row from the memory cell array to the data register) or of the write transfer cycle (transfer of data of one row from the data register 9 to the memory cell array) is carried out based on the timing relation between the signals $\overline{RAS}$, $\overline{CAS}$, $\overline{WE}$ and $\overline{DT}$. The destination designating signal DSF designates which of the control signals $\phi1$ and $\phi2$ is to be generated.

Therefore, in the structure shown in FIG. 9, by transferring data from one of the memory cell arrays to the data register through the transfer gate and then by transferring data from the data register to the other of the memory cell arrays, data transfer between the memory cell arrays 100a and 100b can be realized. Thus, a semiconductor memory device capable of copying contents in one memory cell array to the other memory cell array at one time at high speed can be provided.

Figure 10:
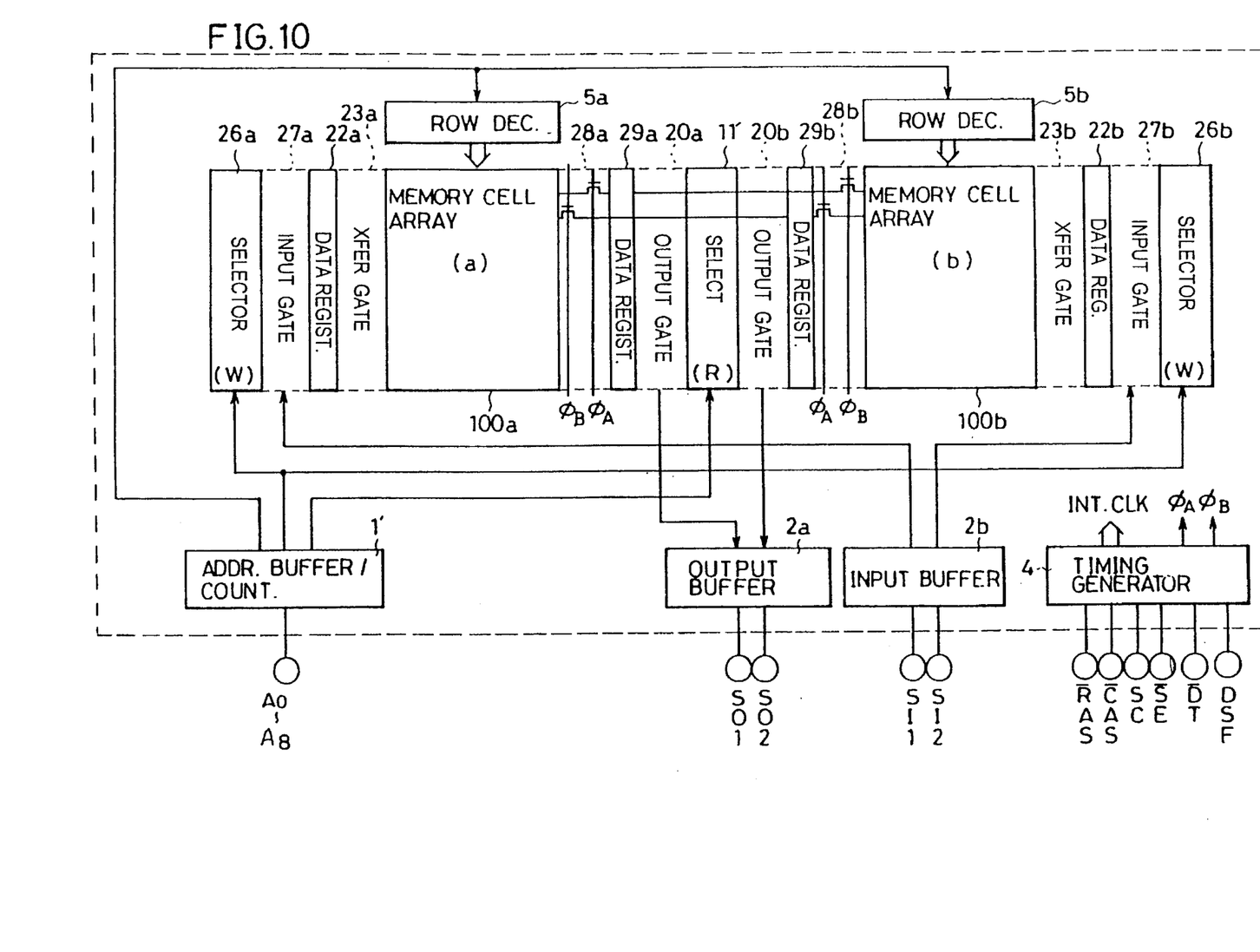
FIG. 10 schematically shows a whole structure of a semiconductor memory device in accordance with a further embodiment of the present invention.

FIG. 10 schematically shows a whole structure of a semiconductor memory device in accordance with a further embodiment of the present invention. Referring to FIG. 10, the semiconductor memory device comprises data registers 22a and 22b exclusively used for data input, and the data registers 29a and 29b exclusively used for data output.

For the data register 22a exclusively used for input, provided are a transfer gate 23a for transferring data from the data register 22a to the memory cell array 100a, a writing selector 26a responsive to the column selecting signal from the address buffer counter 1' for generating a signal to select a column of the data register 22a, and an input gate 27a for connecting the selected bit of the data register to the input buffer 2a based on the column selecting signal from the selector 22a.

For the data register 29a exclusively used for output, provided are internal transfer controlling gates 28a and 28b responsive to the internal transfer controlling signals $\phi_A$ and $\phi_B$ for selectively connecting the data register 29a to the memory cell array 100a or 100b, a selector 11' responsive to a column selecting signal from the address buffer counter 1' for generating a signal to select a column of the data register 29a, and an output gate 20a responsive to the column selecting signal from the selector 11' for connecting the selected bit of the data register 29a to the output buffer 2a.

Similarly, in the portion of the memory cell array 100b, a transfer gate 23b, an input gate 27b and a selector 26b are provided for the data register 22b exclusively used for input, and an output gate 20b, a selector 11' and transfer gates 28b and 28a are provided for the data register 29b exclusively used for output.

In the structure shown in FIG. 10, the address buffer counter 1' includes, as an example, a counter which carries out incrementing operation for successively shifting the selected columns starting from the bit designated by the column address, when the control signal $\overline{SE}$ becomes active. In the semiconductor memory device shown in FIG. 10, the input gate and the output gate are provided separately and data registers are provided for the input gate and the output gate, respectively. In this example also, by providing the transfer gates 28a and 28b between the data registers 29a and 29b and the memory cell arrays 100a and 100b, respectively, it becomes possible to selectively transfer data between the data registers and the memory cell arrays, and accordingly, rearrangement of output data can be readily carried out in the semiconductor memory device.

Although the data transfer path between the memory cell arrays 100a and 100b is not shown in the structure of FIG. 10, a structure for transferring data between memory cell arrays can be readily provided by adding a structure in which the data register exclusively used for output is selectively connected to the data register exclusively used for input.

Although only the SAM port portion is shown in the structure of FIG. 10, it may include the RAM port portion.

Even if the RAM port has an input gate and an output gate provided separately, the same effect as described above can be provided.

Although a semiconductor memory device which can be accessed serially is shown in FIG. 10, the same effect as in the above described embodiment can be provided by using the same structure even in a semiconductor memory device which can be accessed at random. In that case, a common DRAM having an input gate and an output gate provided separately can be restructured to enable data transfer between memory cell arrays by rewriting the symbols of input terminals SO1, SO2, SI1 and SI2 connected to the output buffers 2a and 2b with Q1, Q2, D1 and D2 and by providing column decoders for the memory cell arrays 100a and 100b, respectively.

As described above, in accordance with the present invention, in a semiconductor memory device having a plurality of memory cell arrays, a data register which can be coupled to at least two memory cells is provided, and the data registier is adapted to be selectively connected to one memory cell array in response to a transfer designating signal, whereby data transfer operation between two or imore memory cell arrays become possible, transfer of data row by row between memory cell arrays can be done at one time, and high speed data transfer is realized.

In addition, by switching the connection path of the data register, it becomes possible to rearrange data in the semiconductor memory device, and thus a semiconductor memory device can be provided capable of carrying out processes such as data re-edition at high speed without providing complicated external devices.

When the semiconductor memory device is used as a memory for image processing, the light and shade, color and such of the display images can be readily changed, since rearrangement of the output pixel data is readily carried out, so that an image processing memory having superior processing capability is provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a plurality of data pins for receiving or supplying data bits in parallel, comprising:

a plurality of memory cell arrays, each memory cell array being associated with a different data pin among said plurality of data pins and having a plurality of memory cells arranged in a matrix of rows and columns;

a plurality of register means, each register means having sufficient storage capacity to carry out exchange of data with one row of memory cells of one memory cell array; and means provided corresponding to each of the register means for selectively coupling a corresponding register means to at least two memory cell arrays, said means for selectively coupling including means responsive to a destination memory array designating signal for selectively connecting said corresponding register means to said at least two memory cell arrays for enabling collective transfer of data of one row of one memory cell array, through said corresponding register means, to any other memory cell array of said at least two memory arrays.

2. A semiconductor memory device according to claim 1, wherein said semiconductor memory device is a multiport random access memory having a first port accessing said plurality of memory cell arrays at random sequence and a second port accessing said plurality of memory cell arrays only by a serial sequence;

said plurality of memory cell arrays input or output data in parallel; and said plurality of register means are included in said second port.

3. A semiconductor memory device according to claim 1, further comprising:

data latching means provided separate from said plurality of register means and corresponding to said each memory cell array for serially receiving and latching external data; and means for serially reading stored data of said plurality of register means.

4. A semiconductor memory device according to claim 1, wherein the number of said plurality of register means is at least the same as that of said plurality of memory cell arrays, and said means for coupling is adapted to connect said each memory cell array to said corresponding register means in one to one correspondence.

5. A semiconductor memory device according to claim 1, wherein said each register means is provided per two memory cell arrays, and said means for coupling is adapted to selectively connect only one of said at least two memory cell arrays to the corresponding register means.

6. A multiport semiconductor memory device having a plurality of data pins associated with each port for receiving or supplying data and capable of inputting/outputting data bits by bits, each port being accessible independently from any other port, comprising:

a plurality of random access memory cell arrays, each being associated with a different data pin in the same port and each having memory cells arranged in a matrix of rows and columns, said plurality of random access memory cell arrays being accessible in parallel;

a plurality of register means, each register means arranged to be able to be connected to at least two random access memory cell arrays, the number of said plurality of register means is not less than that of said plurality of random access memory cell arrays, said each register means having sufficient storage capacity to store data of one row of said each random access memory cell array;

means provided corresponding to each of said plurality of register means and responsive to a destination memory array designating signal for selectively connecting a corresponding register means to said at least two random access memory cell arrays to realize data transfer of one row of data of one random access memory cell array, through said corresponding register means, to any other random access memory cell array of said at least two memory cell arrays; and means for serially reading stored data of said each register means through a port other than said same port;

said each register means transferring data of one row at one time with a coupled random access memory cell array and including latching means provided corresponding to each column of said each random access memory cell array for latching signal potential on a corresponding column, and means responsive to a transfer mode designating signal for enabling or disabling said latching means.

* * * * *